United States Patent
Fujii et al.

[11] 4,330,175
[45] May 18, 1982

[54] BLAZED DIFFRACTION GRATING STRUCTURES AND METHOD OF MANUFACTURING THE SAME

[75] Inventors: Yohji Fujii, Yokohama; Junichiro Minowa, Yokosuka, both of Japan

[73] Assignee: Nippon Telegraph & Telephone Public Corporation, Tokyo, Japan

[21] Appl. No.: 58,382

[22] Filed: Jul. 17, 1979

[30] Foreign Application Priority Data

Jul. 18, 1978 [JP] Japan .................................. 53/87344
Apr. 4, 1979 [JP] Japan .................................. 54/40517
Apr. 6, 1979 [JP] Japan .................................. 54/41669

[51] Int. Cl.³ .............................................. G02B 5/18
[52] U.S. Cl. ............................................... 350/162 R
[58] Field of Search ............... 427/162, 163; 156/647, 156/651; 350/162 R

[56] References Cited

U.S. PATENT DOCUMENTS 3,530,010 9/1970 Blakely .......................... 350/162 R

OTHER PUBLICATIONS

Tsang et al., "Preferentially Etched Diffracting Gratings in Silicon", Journal of Applied Physics, vol. 46, No. 5, pp. 2163-2165, May 1975.

Primary Examiner—F. L. Evans
Assistant Examiner—Bruce Y. Arnold
Attorney, Agent, or Firm—Blakely, Sokoloff, Taylor & Zafman

[57] ABSTRACT

In a diffraction grating made of a single crystalline silicon substrate, one major plane thereof is provided with a plurality of asymmetric triangular grooves, each having a wall inclined by an angle $\theta$ with respect to the major surface so as to satisfy an equation $$\theta = \sin^{-1}\frac{m\lambda_B}{2P}$$

where $\theta$ represents the blaze angle, $P$ the pitch of the groove, $\lambda_B$ the blazing wavelength, and $m$ the order of diffraction. The walls of each groove receiving incident light is covered with a metal coat.

The diffraction grating is prepared by using a {hkl} plane (where h=k) inclined by $\theta$ with respect to the {111} plane of the single crystalline silicon as a major surface, and then anisotropic-etching the major surface through an etching mask having stripes having sufficiently smaller width than the grating constant. Preferably, following the anisotropic etching, isotropic etching is made for the major surface.

1 Claim, 24 Drawing Figures

STEP 1 — WAFER PREPARATION
2 — PROTECTIVE FILM FORMATION
3 — PHOTORESIST COATING
4 — EXPOSURE
5 — DEVELOPEMENT
6 — PROTECTIVE FILM ETCHING
7 — PHOTORESIST REMOVAL
8 — ANISO-TROPIC ETCHING
9 — PROTECTIVE FILM REMOVAL
10 — METAL LAYER COATING

BLAZED DIFFRACTION GRATING STRUCTURES AND METHOD OF MANUFACTURING THE SAME

BACKGROUND OF THE INVENTION

This invention relates to a diffraction grating in which a plurality of parallel grooves each having asymmetrical triangular cross-sectional configuration are provided in the major surface of a single crystalline silicon substrate in a predetermined direction and in a closely spaced relationship with a predetermined period or pitch, and a method manufacturing such diffraction grating structure.

Such diffraction grating structure has been used, for an example, as a demultiplexer for a wavelength-division-multiplexing optical fiber transmission system.

According to a prior art method of manufacturing such diffraction grating structure, for the purpose of readily manufacturing at high reproduction-ability a plurality of the diffraction gratings, a ruling machine has been used to prepare a master with a plurality of ribs corresponding to the grooves of the diffraction grating, the master being used for production of replicas.

According to this method, however, it is necessary to use an expensive working machine, that is, the ruling machine and to rely upon a high degree of technique to manufacture the master, thus increasing the cost of the diffraction gratings.

Where many types of diffraction gratings are to be manufactured, it is necessary to prepare a plurality of masters having different pitches and different cross-sectional configuration of the ribs.

As one approach to this problem, a method has been proposed in which a single crystalline silicon is subjected to an anisotropic or preferential etching process as disclosed in Won-Tien Tsang and Shyh Wang paper entitled "Preferentially etched diffraction gratings in silicon", Journal of Applied Physics, Vol. 46, No. 5, May 1975. According to this method, however, the cross-sectional shape of the groove is a symmetrical equilateral triangle or a symmetrical trapezoid so that it is impossible to freely select the blaze angle, one of the important factors of a diffraction grating.

One method of forming grooves having asymmetrical triangular cross-sectional configuration by the suitable selection of the etching initiation surface and anisotropic etching process is disclosed in a paper of Jörg Müller entitled "Ultrafast Multireflection-and Transparent Thinfilm Silicon Photodiodes", International Electron Devices Meeting 1976, Technical Digest 17.6. According to this method, the asymmetrical triangular grooves are contiguous to a metal substrate, and light energy transmitting through the photodiode and reaching the metal substrate is reflected at reflection surfaces along the asymmetrical grooves a number of times so as to increase the efficiency of the photodiode. However, the grating manufactured by this method is not constructed to provide angular dispersion to the light.

Furthermore, a method of manufacturing grooves having asymmetrical cross-sectional configuration in a GaAs substrate by the anisotropic etching technique is disclosed in a Shyh Wang et al Paper entitled "Preferential Chemical Etching of Blazed Gratings in [110]—oriented GaAs", Optics Letters, Vol. 4, No. 3, March 1979.

In anisotropic etching of silicon substrate, the etching speed in the {111} direction (normal to {111} plane) is slower than that in any other directions, whereas in a GaAs substrate, the relative etching speed $R_{hkl}$ of the crystal surface {hkl} is $R_{\{110\}} \geq R_{\{111\}B} \geq R_{\{100\}} >> R_{\{111\}A}$. Thus there are two etching speeds, namely $R_{\{111\}B}$ and $R_{\{111\}A}$ with reference to the {111} plane. For this reason, when the etching initiating plane {11N} (where N=0 to 3) is subjected to the anisotropic etching process as disclosed in this paper, grooves having symmetrical triangular configuration can be formed for etching initiation planes of {110}, (N being zero) and {111} (N being one), but for the etching initiating planes of {112} (N being two) and {113}, (N being three), only grooves having asymmetrical triangular grooves having definite angles of inclination can be obtained. For this reason, this method can not be applied to diffraction grating structures in which it is essential to set any desired blaze angle according to the pitch (grating constant) and blaze wavelength.

SUMMARY OF THE INVENTION

Accordingly, it is an object of this invention to provide a novel diffraction grating structure having a diffraction grating formed in a single crystalline silicon substrate and in particular, being suitable for use as a demultiplexer for a wavelength-division-multiplexing optical fiber transmission system and a method manufacturing the diffraction grating structure.

Another object of this invention is to provide a method of manufacturing a diffraction grating structure capable of reducing the etching time necessary to make sharp the tops of hills between the grooves of the diffraction grating and preventing defective hills.

Still another object of this invention is to provide a method of manufacturing a diffraction grating structure having a curved surface by using a flat sheet of single crystalline silicon substrate.

According to one aspect of this invention, there is provided a diffraction grating structure comprising a diffraction grating including a single crystalline silicon substrate having a major surface {hkl} (where h=k) provided with a plurality of triangular grooves at a pitch of P, each groove having: an asymmetric cross-sectional shape and {111} planes as walls of the grooves formed in the major surface {hkl} which surface is inclined by an angle of θ with respect to the {111} plane so as to satisfy the equation $$\theta = \sin^{-1}\frac{m\lambda_B}{2P},$$

where θ represents the blaze angle, P the pitch of the groove, $\lambda_B$ the blaze wavelength and m the order of diffraction; and a metal coating layer having a uniform thickness and applied to the walls of each of the triangular grooves upon which light is incident.

According to another aspect of this invention, there is provided a method of manufacturing a planar diffraction grating structure in which a major surface of a single crystalline silicon substrate is provided with a plurality of triangular grooves at a pitch of P, each groove having an asymmetric cross-sectional shape and a wall which is inclined by an angle θ with respect to the major surface so as to satisfy the equation $$\theta = \sin^{-1}\frac{m\lambda_B}{2P},$$

where $\theta$ represents the blaze angle, P the pitch of the groove, $\lambda_B$ the blaze wavelength and m the order of diffraction, the method comprising the steps of:

utilizing a {hkl} plane (where h=k) inclined by the angle $\theta$ with respect to a {111} plane of the single crystalline silicon as the major surface;

forming an etching mask on the major surface, the mask including a plurality of spaced apart parallel stripes each having a width substantially smaller than the grating constant;

anisotropic-etching the single crystalline silicon through the etching mask with a first etching solution having different etching speeds for the different crystallographic directions of the single crystalline silicon;

isotropic-etching the single crystalline silicon through the etching mask with a second etching solution having the same etching speed for all crystallographic directions of the single crystalline silicon;

removing the etching mask from the single crystalline silicon, thus obtaining a planar diffraction grating on the single crystalline silicon substrate; and applying a metal coat of uniform thickness onto the walls of each triangular groove of the planar diffraction grating upon which light is incident.

According to still another aspect of this invention, there is provided a method of manufacturing a curved diffraction grating structure in which a major surface of a single crystalline silicon substrate is provided with a plurality of triangular grooves at a pitch of P, each groove having an asymmetric cross-sectional shape and a wall inclined by an angle $\theta$ with respect to the major surface so as to satisfy the equation $$\theta = \sin^{-1}\frac{m\lambda_B}{2P},$$

where $\theta$ represents the blaze angle, P the pitch of the groove, $\lambda_B$ the blaze wavelength, and m the order of diffraction and wherein when the plurality of triangular grooves are projected on a plane and a pattern is formed in which the projections of the grooves are arranged in parallel at the pitch, the method comprising the steps of:

utilizing {hkl} planes (where h=k) inclined by the angle $\theta$ with respect to the {111} plane of the single crystalline silicon as parallel opposing first and second major surfaces;

applying an etching mask onto the first major surface;

anisotropic-etching the single crystalline silicon through the etching mask with an etching solution having different etching speeds with respect to different crystallographic directions of the single crystalline silicon, thus forming a planar diffraction grating, the planar diffraction grating forming a plurality of triangular grooves similar to the first mentioned triangular grooves when the planar diffraction grating is curved with the first major surface inward;

mounting the planar diffraction grating on a supporting member with the second major surface in contact with a curved surface of the supporting member, the curved surface being provided with recesses containing an adhesive and evacuation openings; and applying a negative pressure to the second major surface through the evacuation openings thereby curving the planar diffraction grating to conform with the curved surface.

DESCRIPTION OF THE PREFERRED EMBODIMENTS

Since the diffraction grating structure of this invention is especially suitable for use as a spectroscopic means, for example, an echelette type diffraction grating, the principle of this type of diffraction grating will briefly be described before describing preferred embodiments of this invention.

Figure 1:
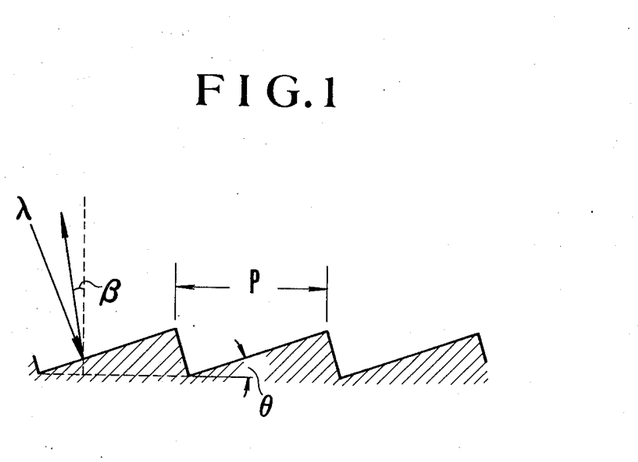
FIG. 1 is a schematic representation of a flat diffraction grating together with principal parameters.

In an echelette type diffraction grating shown in FIG. 1, in order to improve the diffraction efficiency, there must be the following relationship among the blaze wavelength $\lambda_B$, the diffraction order m, the period or pitch of the grooves (grating constant) P, and the blaze angle $\theta$ $$\theta = \sin^{-1} \frac{m\lambda_B}{2P} \quad (1)$$

Figure 2:
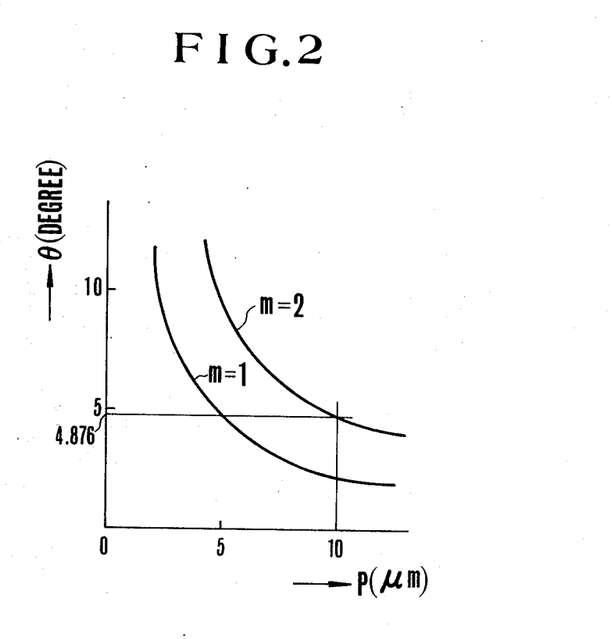
FIG. 2 is a graph showing the relationship between the pitch P between adjacent grooves of a flat diffraction grating and an angle $\theta$ between the major surface of a flat diffraction grating and one of the two flat inner surfaces (walls) of each groove.

Thus, where the blaze wavelength $\lambda_B$ is equal to 8500 Å, the relationship between the pitch P and the blaze angle $\theta$ is shown by curves in FIG. 2 where the first (m=1) and second (m=2) orders are used as parameters. The pitch P is an important parameter for determining the angular dispersion of the diffraction grating. P is determined by the following equation $$\frac{d\beta}{d\lambda} = \frac{1}{P \cdot \cos\beta} \quad (m=1) \quad (2)$$

where $\lambda$ represents the wavelength of the incident light, and $\beta$ represents an angle between a line normal to the surface of the diffraction grating and the diffracted light. Where the incident wave comprises multiple waves having wavelengths $\lambda_1$ and $\lambda_2$, the pitch P can be determined by equation (2) which makes different, by $\Delta\beta$, the diffraction angles $\beta_1$ and $\beta_2$ of the incident waves having wavelengths $\lambda_1$ and $\lambda_2$ respectively, that is, $(\beta_2 - \beta_1)$. More specifically, incident wavelengths $\lambda_1$ and $\lambda_2$ are diffracted at angles $\beta_1$ and $\beta_2$, respectively, and it is desired to set $\Delta\beta = \beta_1 - \beta_2$ to a desired value. Thus, according to equation (2), the pitch P is determined so as to obtain the desired $\Delta\beta$ when the incident light of wavelengths $\lambda_1$ and $\lambda_2$ is present. Symbol $\theta$ represents the angle necessary to most efficiently diffract light having a specific diffraction order m and a specific wavelength $\lambda_B$ as determined by equation (1). For this reason, in the echelette type diffraction grating, it is essential to select a combination of the grating constant P and the blaze angle $\theta$ that can simultaneously satisfy equations (1) and (2).

Figure 3:
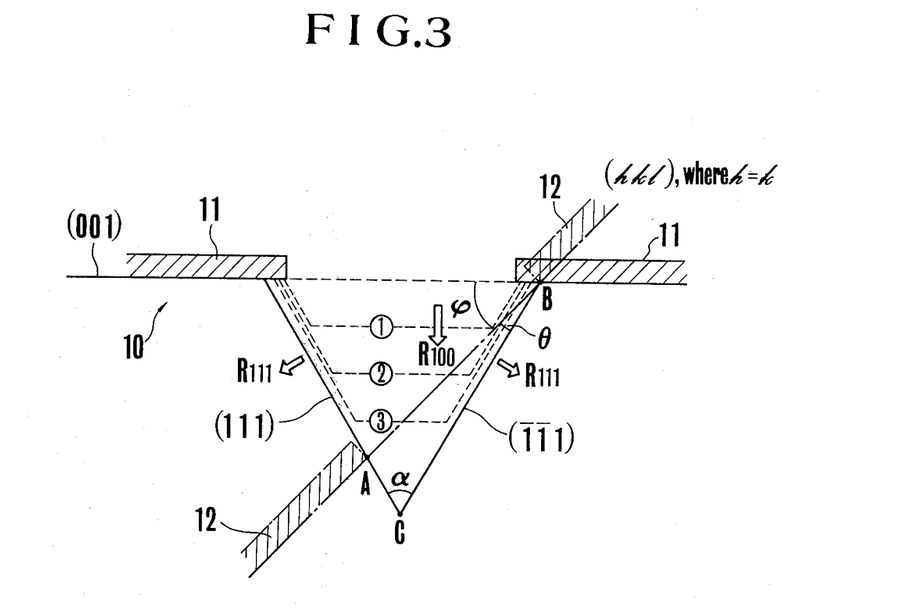
FIG. 3 is a schematic representation showing the principle of the method of manufacturing a diffraction grating by anisotropic etching of a single crystalline silicon substrate.

Turning now to FIG. 3, there is shown a manner of producing a diffraction grating having a groove shape that satisfies equation (1) according the principle of this invention, that is, by anisotropic-etching a single crystalline silicon substrate with a specific etching solution. Thus, a mask 11 is formed on the {100} plane, for example, the (001) plane of a single crystalline silicon substrate 10. Thereafter, when the surface is selectively etched with an APW etching solution containing amine pyrocatechol water (NH$_2$(CH$_2$) NH$_2$+C$_6$H$_4$(OH)$_2$+H$_2$O), an aqueous solution of alkalines such as NaOH and KOH, or an aqueous solution of amines such as hydrazine and ethylene diamine, the etching speed of the {111} plane, more particularly, the etching speed $R_{111}$ in the direction of {111} is smaller than that of any other surface {hkl}. That is, the etching speed $R_{hkl}$ in the direction of {hkl} is such that the single crystalline silicon substrate 10 will be anisotropically etched according to the order of dotted lines ①  through ③ at the larger etching speed $R_{100}$ and the smaller etching speed $R_{111}$, thus forming a symmetrical V-shaped groove having an equilateral sectional configuration defined by the planes {111} and {$\bar{1}\bar{1}1$} shown by solid lines. In this case the angle $\alpha$ is equal to 70.53°, and the sheet of FIG. 3 corresponds to the {110} plane, more particularly {1$\bar{1}$0} plane. One may refer to, for example, "THIN FILM PROCESSES", Chapter V-1, Chemical Etching, PP 401 to 496, edited by John L. Vossen and Werner Kern and published by ACADEMIC PRESS, New York, 1978, which discloses that the aforementioned various etchants are effective for anisotropic etching of single crystalline silicon. With regard to the technique described above, reference is made to the above-mentioned Won-Tien Tsang and Shyh Wang Paper entitled "Preferentially etched diffraction gratings in silicon".

Figure 4:
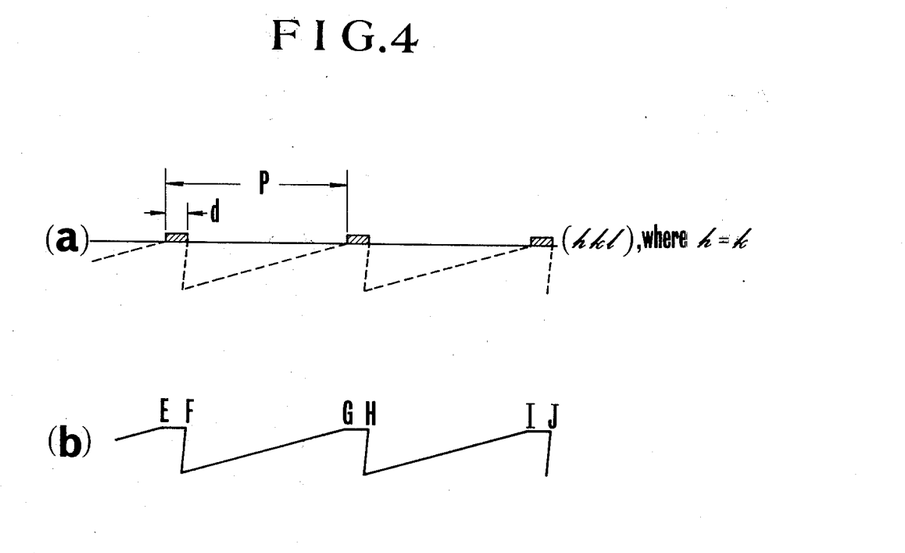
FIGS. 4a and 4b are schematic representations of a diffraction grating prepared by the principle shown in FIG. 3.
Figure 5:
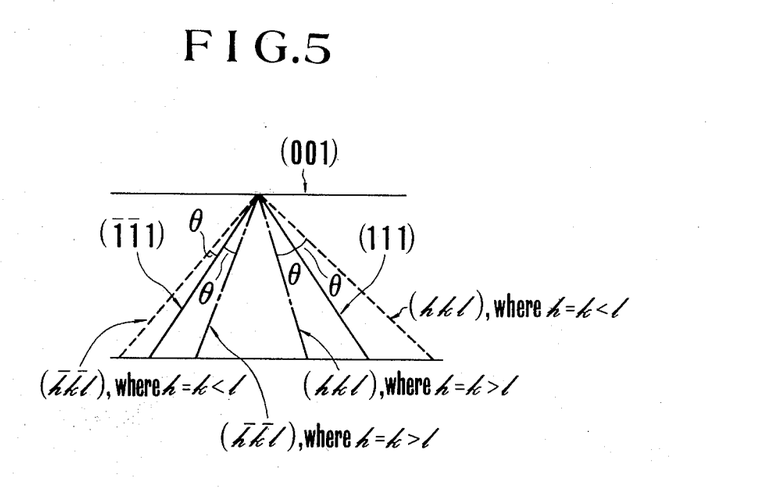
FIG. 5 is a diagram showing an etching initiation surface applicable to this invention.

At first a wafer is prepared in which the {hkl} plane, where h=k, intersects the {$\bar{1}\bar{1}1$} plane at an angle $\theta$ or intersects the {001} plane at an angle $\rho = \frac{1}{2}(180-\alpha)-\theta$, as shown by dot and dash lines in FIG. 3. In the following, the description will be made with reference to a figure viewed in the direction of [1$\bar{1}$0], but it should be understood that the description is also applicable to a figure viewed in the direction of {110} which is equivalent to [1$\bar{1}$0]. Where an etching protective film 12 is applied along a line interconnecting points A and B, it is possible to form by anisotropic etching a groove having a cross-section $\triangle ACB$ in the silicon wafer utilizing the {hkl} plane (where h=k) as the wafer surface, in the same manner as the aforementioned case where the {001} plane was used as the wafer surface. For this reason, a diffraction grating shown in FIG. 4 can be prepared by forming a stripe shaped etching protective film on the {hkl} plane (where h=k) as shown in FIG. 4a, the etching protective film having a plurality of parallel strips having a pitch of P and a width of d and extending in the direction of {110}, that is, perpendicularly to the sheet of FIG. 3, the anisotropic-etching with a predetermined etching solution, and finally removing the etching protective film. The condition h=k in the foregoing description is based on the following reason. More particularly, in FIG. 5 is a view of the V-shaped grooves viewed in the direction normal to the {1$\bar{1}$0} plane or the sheet of drawing, that is, in the direction of [1$\bar{1}$0], so that the planes {111} and {$\bar{1}\bar{1}1$} are shown as straight lines. For this reason, the etching plane (hkl) according to this invention which intersects the {111} plane or {$\bar{1}\bar{1}1$} plane at the angle $\theta$ will be seen as a straight line when viewed in the direction of [1$\bar{1}$0]. The {hkl} plane which satisfies this condition should have the relation of h=k.

Figure 6:
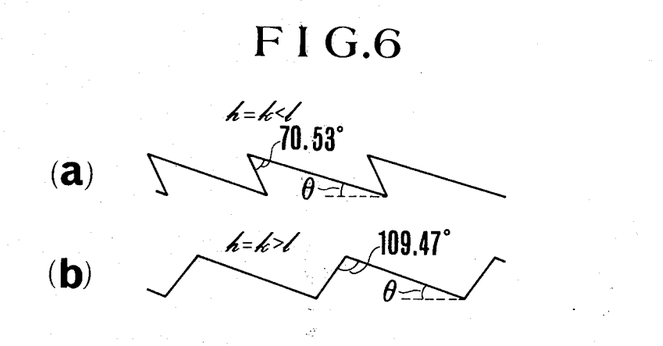
FIGS. 6a and 6b are diagrammatic representations showing different shapes of grooves.

Let us assume now that h=k<l, as shown by dotted lines in FIG. 5. Then, an asymmetrical diffraction grating will be formed as shown in FIG. 6a and having a bottom angle $\theta$ and an apex angle of 70.53°. On the other hand, where h=k>l, as shown by dot and dash lines in FIG. 5, an asymmetrical grating will result having a bottom angle $\theta$ and an apex angle of 180°−70.53°=109.47° as shown in FIG. 6b.

Figure 7:
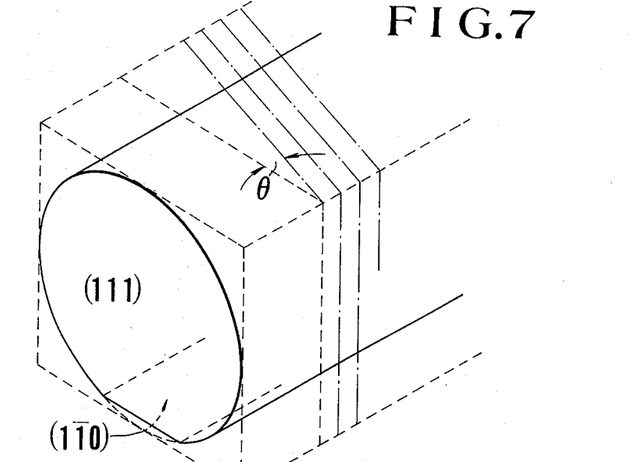
FIG. 7 is a perspective view showing one exemplified manner of cutting an ingot for obtaining silicon wafers utilized in this invention.

Silicon wafers utilized in this invention can be prepared by slicing an ingot shown in FIG. 7 along dot and dash lines in accordance with the angle $\theta$ calculated by equation (1). The value of $\theta$ is 4.876° where the blaze wavelength $\lambda_B$=8,500 Å, the diffraction order m=2, and the pitch P=10 microns.

Figure 8:
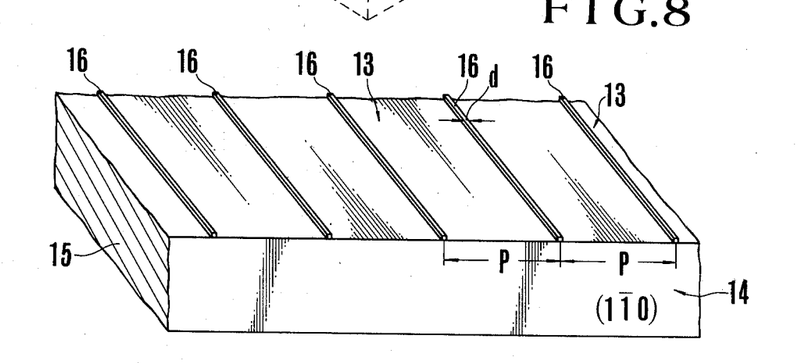
FIGS. 8 through 10 are schematic perspective views showing successive steps of one example of the method of manufacturing a diffraction grating according to this invention.

Thus, a single crystalline silicon wafer is prepared in which a surface inclined by $\theta$ with respect to the {111} plane comprises the major surface 13 and the side surface 14 comprises the (1$\bar{1}$0) plane of the crystal. Then a plurality of parallel mask stripes 16 having a small width d are formed on the major surface 13 with a pitch P as shown in FIG. 8. Then, the wafer is selectively etched with the etching solution described above by using the mask stripes.

Figure 9:
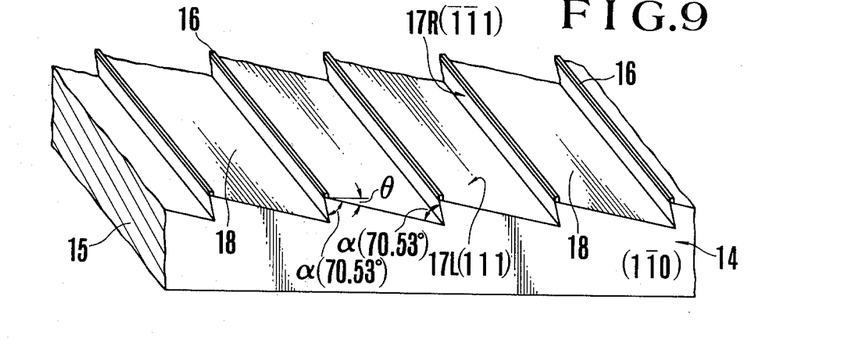

Then the portions of the silicon crystal 15 between adjacent mask stripes are etched. Then a plurality of inverted triangular asymmetrical grooves 18 are formed, as shown in FIG. 9, each having one inner surface 17L or {111} plane inclined by $\theta$ with respect to the major surface 13 and the other inner surface 17R or the $\{\bar{1}\bar{1}1\}$ plane, the length of the base of the inverted triangular groove being substantially equal to the spacing or pitch P between adjacent mask stripes 16. After forming the plurality of grooves 18, the etching process of the single crystalline silicon 15 is terminated.

Figure 10:
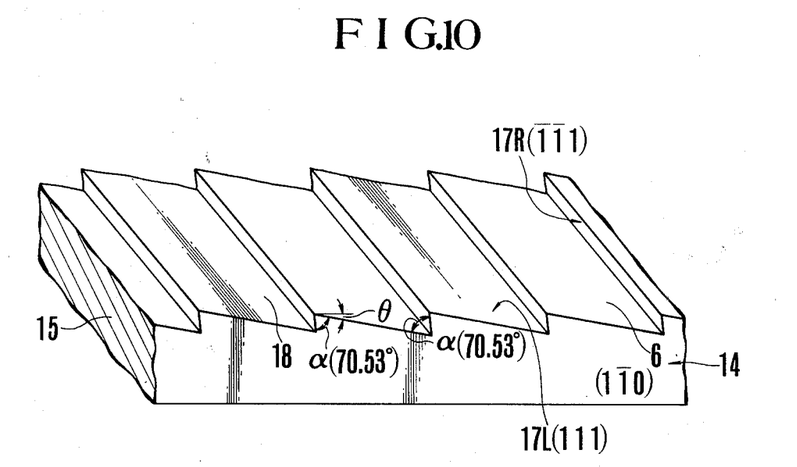

Thereafter, the mask stripes 16 are removed to obtain a desired planar diffraction grating provided with the plurality of inverted triangular grooves 18 in the major surface.

Figure 11:
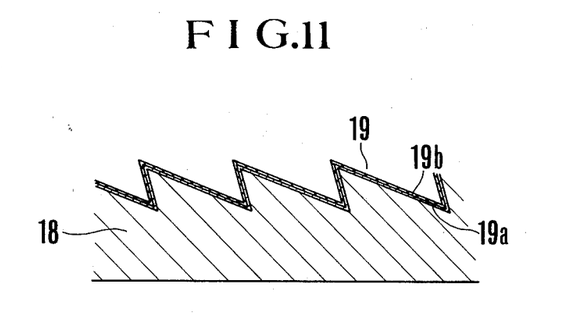
FIG. 11 is a cross-sectional view showing the construction of a metal coating applied onto the diffraction grating embodying the invention.

For the purpose of improving the absolute diffraction efficiency of the resulting diffraction grating, a metal coat 19 is formed comprising, for example, a nichrome layer 19a vapor deposited or sputtered and a gold layer 19b deposited on the nichrome layer by the same method. Gold layer is preferred because it is possible to readily obtain percentage of the reflection of higher than 95% with respect to wavelength between 7000 Å and 1.6 microns, especially when the diffraction grating of this invention is utilized as a demultiplexer for a wavelength-division-multiplexing optical fiber transmission system. If deposited directly on the grooves 18, the gold layer 19b will react with silicon to form an eutectic state. Therefore, there is provided the lower layer 19a of nichrome which hardly reacts with gold to form an eutectic state. The upper layer of the coat 19 is made of such metals having the highest percentage of reflection as gold, aluminum, etc., whereas the lower layer acts as a buffer when the upper layer is deposited thereon and it should be understood that nickel, chromium or titanium may be substituted for nichrome.

The diffraction grating of this invention can be prepared in a manner described above. A typical example of the steps of manufacturing the diffraction grating will now be described with reference to FIG. 12.

Figure 12:
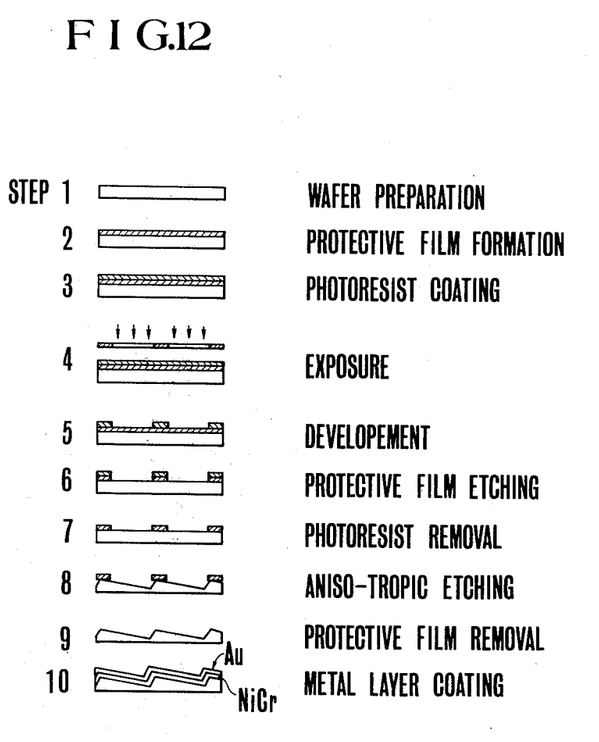
FIG. 12 shows successive steps of manufacturing the diffraction grating of this invention.

At first, an etching protection film consisting of $SiO_2$ or $Si_3N_4$ is formed on a predetermined silicon wafer (whose major surface is inclined by $\theta$ with respect to the {111} plane) as shown in steps 1 and 2 of FIG. 12. At step 3, a photoresist is coated on the surface of the wafer. Then, a mask pattern is formed on the etching protective film by using a mask having a pitch P and a stripe width of d, and exposing and developing the exposed photoresist as shown in steps 4 to 6. Windows are formed through the protective film with buffer hydrofluoric acid for the $SiO_2$ film and with plasma etching for the $Si_3N_4$ film. At step 7 the photoresist is removed. At step 8, the wafer formed with windows is anisotropically etched in a KOH solution to form grooves having asymmetric triangular cross-sectional configuration in the surface of the wafer. Then, at step 9, the etching protective film is removed. The percentage surface reflection of the silicon wafer is about 35% in a 0.8 micron wavelength region. To improve this surface reflection to about 98%, a metal layer consisting of gold on nichrome, for example, is vapor deposited, at step 10.

When a diffraction grating is prepared by the steps just described, flat portions are formed at EF, GH, IJ . . . corresponding to the stripes of the etching protective film as shown in FIG. 4b. For this reason, in order to sufficiently improve the diffraction efficiency, it is necessary to make the stripe width d to be much smaller than the pitch P. Actually, however, as it is impossible to decrease the stripe width d beyond a limit, the effect of these flat portions can not be neglected as the pitch P decreases.

Another feature of this invention lies in the provision of a novel method that makes the flat portions EF, GH, IJ . . . shown in FIG. 4b to become sufficiently smaller than the pitch P while maintaining the stripe width d of the etching protective film at a relatively larger value.

Figure 13:
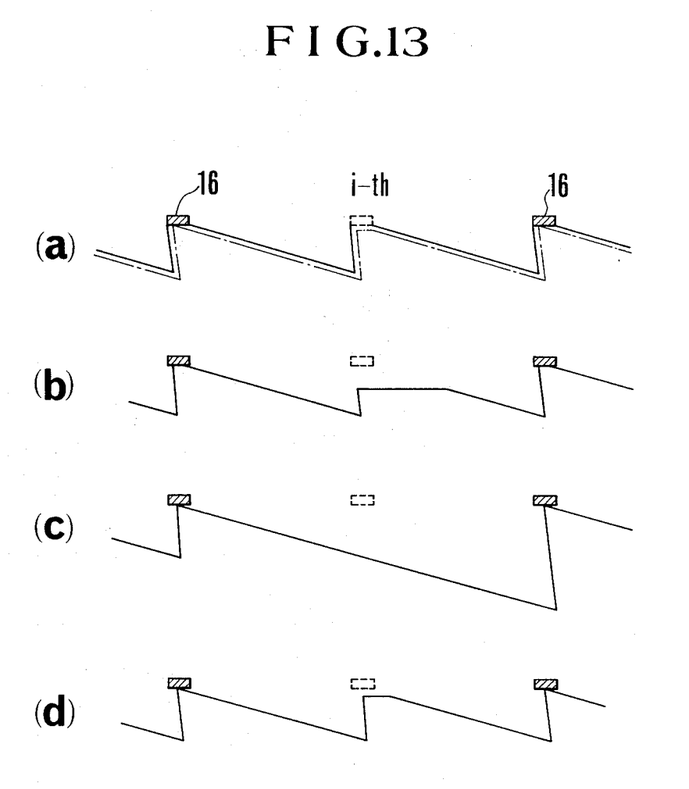
FIGS. 13a through 13d are diagrams for explaining the advantageous effect of the isotropic etching according to this invention.

More particularly, the grooves bounded by {111} planes are formed by the anisotropic etching. Thereafter, when the wafer is subjected to isotropic etching with a nitric acid-hydrofluoric acid etching solution without removing the protective film, the flat portions can be sufficiently reduced. Instead of using the isotropic etching, where the anisotropic etching is performed for a sufficiently long time, the portions can be reduced because $R_{111} \neq 0$. The isotropic etching is more advantageous than the anisotropic etching over a long time in that the required etching time can be reduced because it is possible to make the etching speed $R'_{111}$ in the direction of {111} at the time of the isotropic etching to be much larger than the etching speed $R_{111}$ in the direction of {111} at the time of the anisotropic etching, thereby greatly reducing the required etching time. This reduces exfoliation of the protective film during etching. Moreover, in the event that the etching protective film happens to peel off, the isotropic etching is superior as evidenced by FIGS. 13a to 13d. More particularly, assume now that under a state shown in FIG. 13a, the i-th mask stripe peels off. In the case of the anisotropic etching, since $R_{111} < R_{hkl}$, the etching proceeds as shown in FIG. 13b until some of the tooth shaped portions disappear as shown in FIG. 13c. With the isotropic etching, since the etching speeds in all directions are the same, the same amount of the wafer is etched off at any portion thereof as shown by dot and dash lines in FIG. 13a so that the wafer would be etched as shown in FIG. 13d. Comparison of FIGS. 13a with FIG. 13c shows that even when some of the stripes of the etching protective film (in this case the i-th stripe) peel off, the isotropic etching of this invention can minimize the adverse effect of such an exfoliation.

Figure 17:
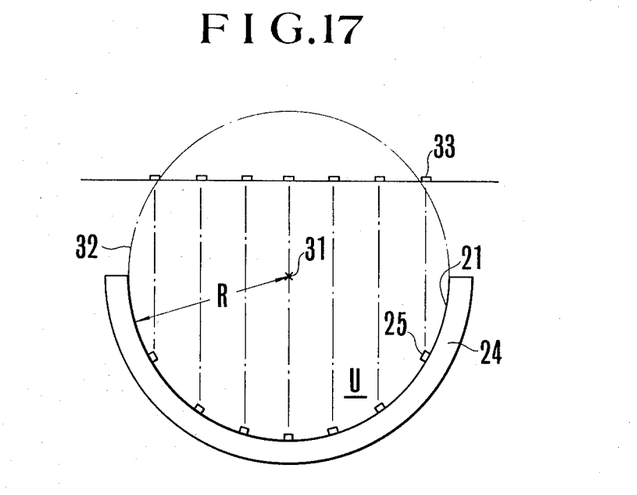
FIG. 17 is a diagram useful to explain unequal pitch of an etching mask utilized to manufacture the curved diffraction grating.
Figure 18:
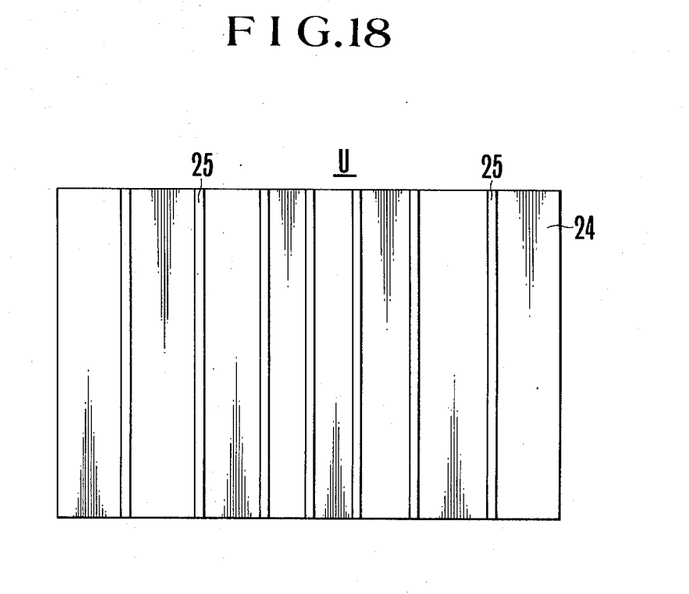
FIG. 18 is a plan view showing the pattern of the etching mask shown in FIG. 17.

While the foregoing description relates to an echelette type planar diffraction grating, it is also possible to prepare a curved diffraction grating where a method to be described hereunder is used. While in the following description, a concave diffraction grating having a cylindrical surface will be described, it should be understood that diffraction gratings having any other shapes can also be prepared. At first a planar diffraction grating structure is prepared as described above, and then the structure is flexed below its elasticity limit to obtain a concave diffraction grating structure having a cylindrical surface. As shown exaggerated in FIG. 17, the etching mask utilized to prepare the planar diffraction grating structure of this embodiment has a plurality of stripes 25 spaced apart at different spacings, but it is necessary that these different spacings are equalized when projected onto a plane 33 after curving. The plane 33 is parallel with the major surface 21 before curving. When curving, the single crystalline silicon substrate 24 along with the mask is curved such that the major surface 21 is contained in a cylindrical surface 32 defined by a radius R stanting from an axis 31 extending in parallel with the stripes 25 of the mask. The plurality of the stripes 25 will form a pattern on the plane 33, in which pattern the stripes 25 are projected on the plane 33 at a predetermined pitch P or with an equal spacing, although before curving, the spacing between adjacent stripes increases gradually from the central portion toward opposite sides as shown in FIG. 18. Although the mask described above has an unequal pitch, where R>>P, the pitch may be equal.

Figure 14:
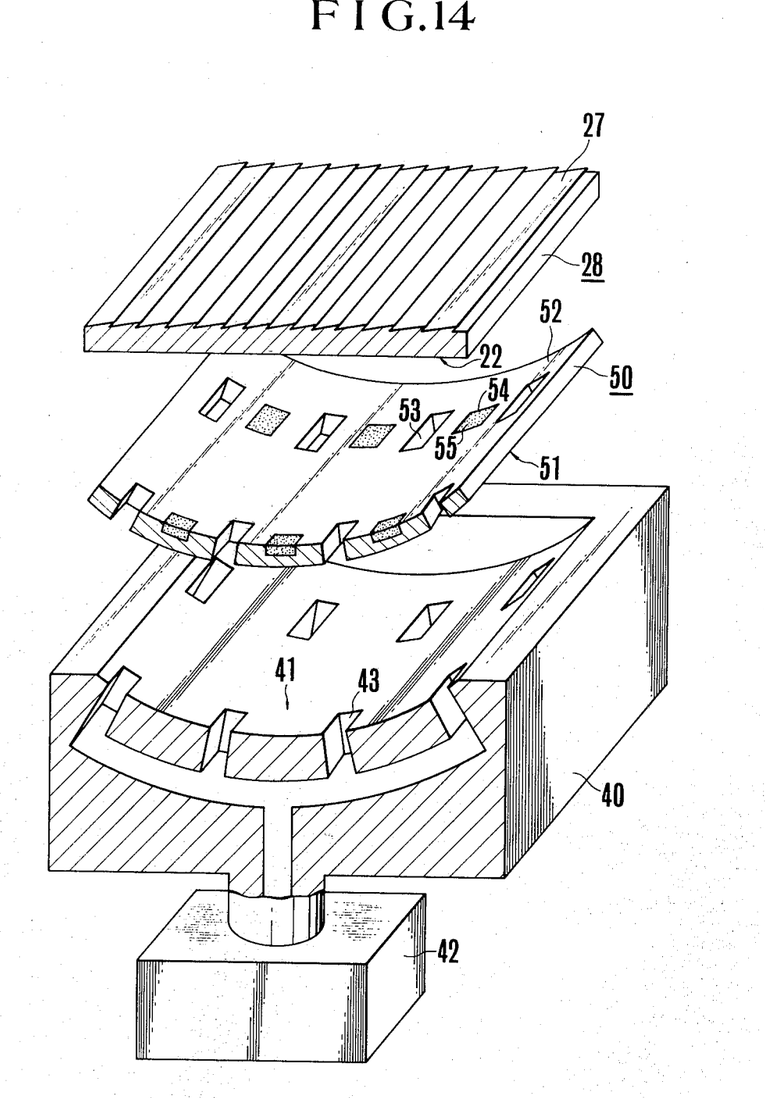
FIGS. 14 and 15 are perspective views showing one example of manufacturing a nonplanar or curved diffraction grating of this invention.

Then, a planar diffraction grating structure 28 prepared as described above is curved such that its surface formed with a plurality of inverted triangular grooves would conform to the cylindrical surface by using apparatus shown in FIG. 14.

The apparatus shown in FIG. 14 comprises a curved diffraction grating supporting member 50 having a concave cylindrical surface 52 which corresponds to the concave cylindrical surface 32, and a convex cylindrical surface 51 on the opposite side and conforming to the concave cylindrical surface 41 of a supporting base 40 which is mounted on an evacuation device 42. The concave cylindrical surface of the supporting base 40 is provided with a plurality of evacuation openings 43 communicating with the evacuation device 42. The curved diffraction grating supporting member 50 is provided with a plurality of evacuation openings 53 which would be coupled with the evacuation openings 43 when the supporting member 50 is mounted on the supporting base 40, and a plurality of recesses on the opposite side. The concave cylindrical surface 52 of the supporting member 50 is shaped to just conform the convex cylindrical surface of the second major surface 22 of single crystalline silicon comprising the planar diffraction grating when it is curved as described above. While in the foregoing description, mating surfaces 41 and 51 were shown as cylindrical, the invention is not limited to cylindrical surfaces but any other shapes may be permitted so long as these mating surfaces have a complementary relationship.

Figure 15:
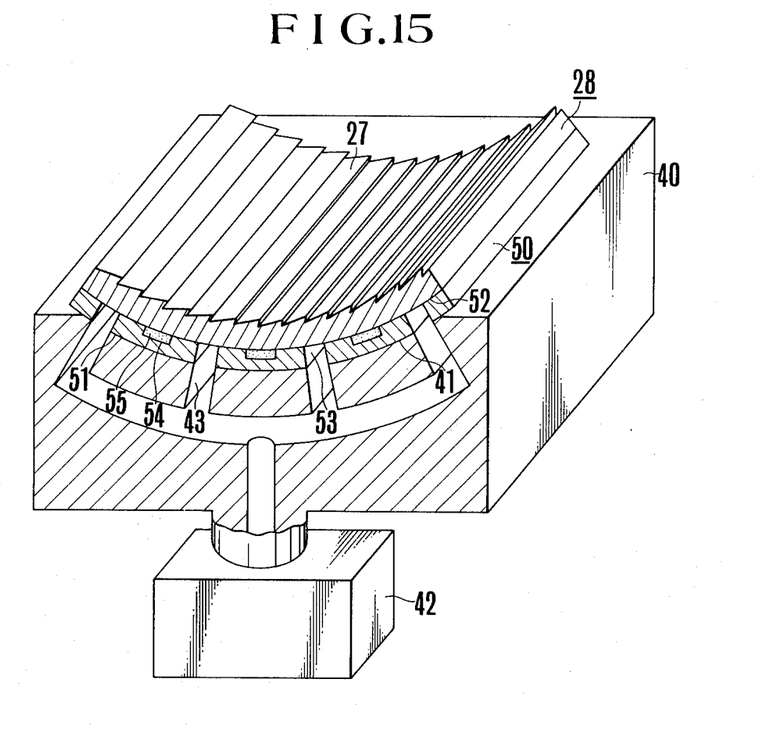
Figure 16:
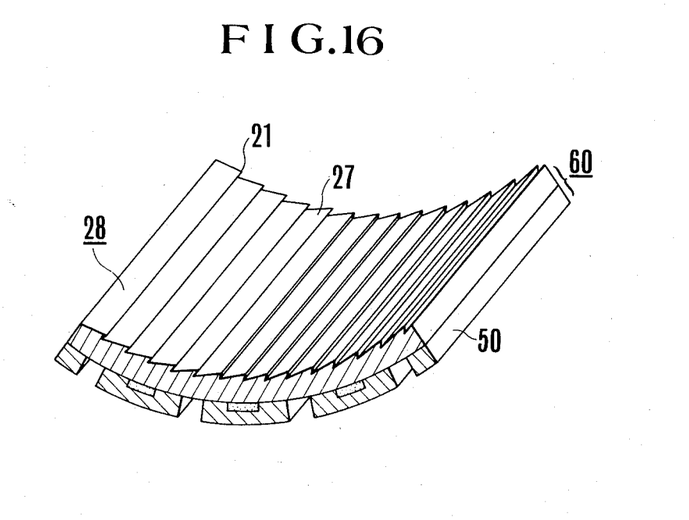
FIG. 16 is a perspective view showing a nonplanar diffraction grating embodying the invention.

After filling an adhesive 55 in the recesses 54, the curved diffraction grating supporting member 50 is mounted on the supporting base 40 such that the evacuation openings 53 of the former would align with the evacuation openings 43 of the latter. Then, the planar diffraction grating 28 is mounted on the supporting member 50 with the second major surface 22 directed downwardly. Thereafter, the evacuation device 42 is operated to apply negative pressure to the major surface 22, thus curving the planar diffraction grating until a state shown in FIG. 15 is reached in which the curved diffraction grating 28 is firmly bonded to the supporting member 50 with the adhesive. After setting the adhesive, the operation of the evacuation device 42 is stopped and then the supporting member 50 is removed from the supporting base 40 together with the curved diffraction grating structure, as shown in FIG. 16.

Thus, the resulting curved diffraction grating structure has a plurality of inverted triangular grooves 28 which are arranged in parallel with a predetermined pitch. In the manufacture of the curved diffraction grating, the metal coating step may be carried out before or after curving the planar diffraction grating structure 28. Metal coat prepared before curving will not be damaged or peeled off during the process of curving.

Figure 19:
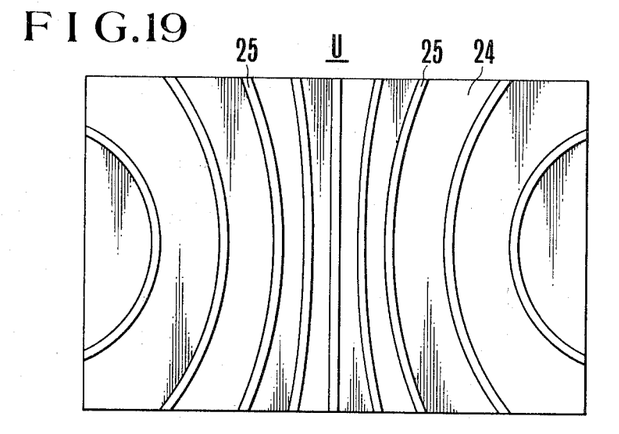
FIG. 19 is a plan view showing another example of the pattern of the etching mask utilized to manufacture the curved diffraction grating.

According to the prior art method, in order to prepare a variety of curved diffraction gratings, it has been necessary to prepare many types of masters provided with ribs having different pitches and different cross-sectional configurations. But the method of this invention can eliminate such disadvantage. Of course, the isotropic etching process can be applied to the manufacture of the non-planar diffraction gratings. For example, to manufacture spherically concaved diffraction grating, a mask having a pattern as shown in FIG. 19 may be used in which members corresponding to those shown in FIG. 18 are designated by the same reference characters for the sake of assisting easy understanding.

Figure 20:
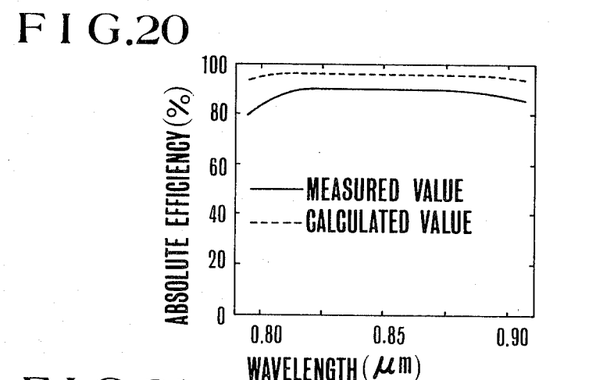
FIG. 20 is a graph showing the absolute efficiency of diffraction of a planar diffraction grating manufactured by the method of this invention.

FIG. 20 shows the result of measurement of a planar diffraction grating prepared by the method described above and having a pitch of 4 microns, and a blaze angle of 6.2°, the measurement being made for a 0.8 micron wavelength region with incident light normal to the surface of the diffraction grating. As can be noted from FIG. 20, although the efficiency decreases slightly on the shorter wavelength side and the longer wavelength side, an absolute diffraction efficiency of about 90% (about $0.5d\beta$ in terms of loss) was obtained between 0.82 and 0.88 microns. FIG. 20 shows the result of measurement performed on a diffraction grating prepared by using a protective film consisting of $Si_3N_4$, but substantially the same characteristic was obtained when the protective film was made of $SiO_2$.

Dotted lines in FIG. 20 show a theoretical curve, and the difference between theoretical values and the measured values is attributable to some imperfectness (imperfect groove configuration and nonuniform groove pitch) of the diffraction grating.

The absolute diffraction efficiency of a commercially available diffraction grating (manufactured by Bausch & Lomb and having a 0.86 micron blaze, 300 grooves/mn, and coated with gold) was measured to be about 85% ($0.7d\beta$ in terms of loss) at a wavelength of 0.85 micron. This diffraction grating is said to have higher diffraction efficiency than any other commercially available diffraction gratings. Comparison of these data shows that the diffraction grating of this invention has a higher efficiency than the prior art diffraction gratings.

Figure 21:
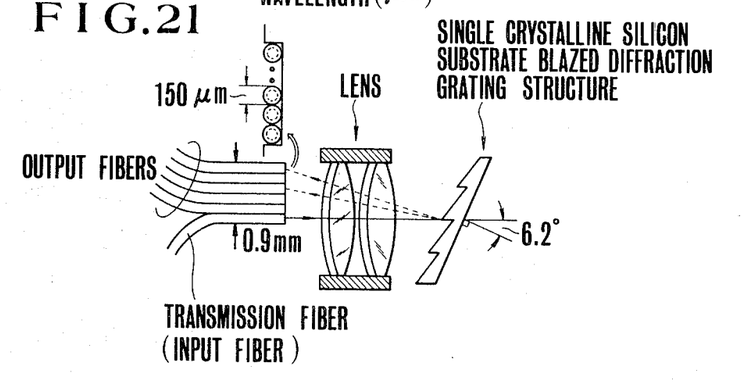
FIG. 21 is a diagrammatic representation of one example of a demultiplexer incorporated with a single crystalline silicon substrate diffraction grating structure.

The diffraction grating structure of this invention is suitable to use a demultiplexer for a wavelength-division-multiplexing optical fiber transmission system. FIG. 21 shows the construction of a Littrow mounting demultiplexer which was used in our experiment. Transmission fiber (input fiber) and output fibers are densely arrayed on the focal plane of a lens by utilizing the fact that these fibers have high accuracies of their outer diameters. As the output fibers, we prepared two types of fibers, one (fiber A) step type index having a core diameter of 100 microns and $\Delta n = 1.1\%$, and the other (fiber B) step index fiber having a core diameter of 130 microns and $\Delta n = 1.1\%$. The diffraction grating used in the experiment had characteristics similar to those shown in FIG. 20. The focal length f of the lens can be determined by the following equation $$f = \frac{P \cos B}{d\lambda/dl} \quad (3)$$

where p represents the period of the diffraction grating, $\beta$ the angle between a normal to the plane of the diffraction grating and diffracted light, and $d\lambda/dl$ the wavelength dispersion on the focal plane. Where P=4 microns, $d\lambda/dl$ can be calculated as 250 Å/150 microns based on the wavelength spacing (the spacing was set to be 250 Å in our experiment) of the channels, and the center-to-center distance between adjacent output fibers each having an outer diameter of 150 microns. In the Littrow mounting shown in FIG. 21, the angle $\theta$ is equal to the bottom angle $\beta$ of the diffraction grating. Thus, $\beta = 6.2°$. By substituting these data in equation (3) we obtain f=23.8 mm. Four unit lenses were combined for the purpose of decreasing aberration and the surface of the lens was coated with reflection preventing films for decreasing reflection loss.

With the construction described above, we obtained a low loss demultiplexer having an insertion loss of 1.1d to 1.4d$\beta$, and a cross-talk between adjacent channels, of higher than 30d.

What is claimed is:

1. A diffraction grating structure comprising a planar diffraction grating including a single crystalline silicon substrate having a major surface {hkl} (where h=k) provided with a plurality of triangular grooves at a pitch of P, each groove having an asymmetric cross-sectional shape and {111} planes as walls of each groove formed in the major surface {hkl} which is inclined by an angle of $\theta$ with respect to the {111} plane so as to satisfy the equation $$\theta = \sin m\lambda_B/2P$$

where $\theta$ represents a blaze angle, P the pitch of the groove, $\lambda_B$ the blaze wavelength and m the order of diffraction; a metal coat layer having a uniform thickness and applied to the walls of each of said triangular grooves upon which light is incident; and wherein said planar diffraction grating is flexed below its elasticity limit to obtain a curved diffraction grating structure.

* * * * *